United States Patent
Hoirup

(10) Patent No.: US 11,309,924 B1
(45) Date of Patent: Apr. 19, 2022

(54) METHODS AND APPARATUSES FOR MITIGATING AN IMPACT OF SETTLING TIMES OF COMPONENTS IN MATCHING NETWORKS

(71) Applicant: NXP USA, Inc., Austin, TX (US)

(72) Inventor: Carsten Hoirup, Raleigh, NC (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/072,433

(22) Filed: Oct. 16, 2020

(51) Int. Cl.
  *H04B 1/04* (2006.01)
  *H04B 1/10* (2006.01)
  *H04L 5/14* (2006.01)

(52) U.S. Cl.
  CPC ......... *H04B 1/0458* (2013.01); *H04B 1/1036* (2013.01); *H04L 5/14* (2013.01)

(58) Field of Classification Search
  CPC .... H03J 2200/06; H04B 17/12; H01Q 9/0442
  See application file for complete search history.

(56) References Cited

U.S. PATENT DOCUMENTS

| | | | |
|---|---|---|---|
| 9,106,190 B2 | 8/2015 | Devison | |
| 9,300,332 B2 | 3/2016 | Dakshinamurthy et al. | |
| 9,374,113 B2 | 6/2016 | Manssen et al. | |
| 9,671,765 B2 | 6/2017 | Manssen et al. | |
| 2008/0261544 A1 | 10/2008 | Blin | |
| 2014/0177686 A1 | 6/2014 | Greene et al. | |
| 2014/0329472 A1* | 11/2014 | Kovacs | H04B 17/24 455/67.14 |

FOREIGN PATENT DOCUMENTS

| | | |
|---|---|---|
| EP | 0685936 A2 | 12/1995 |
| EP | 0685936 A3 | 8/1996 |

* cited by examiner

*Primary Examiner* — Kevin Kim

(57) ABSTRACT

Aspects of the subject disclosure may include, for example, changing a tuning value of a tunable component coupled to an antenna from a first tuning value to a second tuning value during a first stage, and changing the tuning value of the tunable component from the second tuning value to a third tuning value during a second stage that occurs subsequent to the first stage, wherein during each of the first stage and the second stage the antenna is not utilized by a transmitter for communication purposes, wherein the first stage and the second stage are separated from one another by a first active region, and wherein during the first active region the transmitter causes a first signal to be transmitted from the antenna for communication purposes. Other embodiments are disclosed.

18 Claims, 11 Drawing Sheets

200

300

LOOK-UP TABLE

| |
|---|
| RAT 1; Modulation type 1; phase/amp shift limits; tuning steps |
| RAT 1; Modulation type 2; phase/amp shift limits; tuning steps |
| ⋮ |
| RAT 1; Modulation type n; phase/amp shift limits; tuning steps |
| RAT 2; Modulation type 1; phase/amp shift limits; tuning steps |
| RAT 2; Modulation type 2; phase/amp shift limits; tuning steps |
| ⋮ |
| RAT 2; Modulation type n; phase/amp shift limits; tuning steps |
| RAT N; Modulation type 1; phase/amp shift limits; tuning steps |
| RAT N; Modulation type 2; phase/amp shift limits; tuning steps |
| ⋮ |
| RAT N; Modulation type N; phase/amp shift limits; tuning steps |

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| Band N; Use Case 1; Desired tuning state |
| Band N; Use Case 2; Desired tuning state |
| ⋮ |
| Band N; Use Case n; Desired tuning state |

METHODS AND APPARATUSES FOR MITIGATING AN IMPACT OF SETTLING TIMES OF COMPONENTS IN MATCHING NETWORKS

FIELD OF THE DISCLOSURE

The subject disclosure relates to methods and apparatuses for mitigating an impact of settling times of components in matching networks.

BACKGROUND

Communication systems, inclusive of base stations, frequently utilize impedance matching circuits to enhance a quality associated with signals that are communicated/conveyed by the communication systems. For example, an impedance matching circuit may be used to match an impedance of radio frequency (RF) front end components of a base station to characteristics of one or more other components of the base station, such as one or more antennas.

Many impedance matching circuits incorporate tunable components, such as barium strontium titanate (BST) tunable capacitors. While the use of tunable components, such as tunable capacitors, is effective in terms of obtaining/realizing impedance matching (thereby increasing RF performance/quality), the tunable components may take on the order of at least 100 microseconds in terms of a settling time associated with a transition from a first/initial state/value to a commanded, second/final state/value (due to the resistive-capacitive (RC) load represented by the tunable capacitor, and the RC time constant associated therewith). In contrast, in many time division duplex (TDD) based communication systems (e.g., TD-LTE and 5G new radio (NR), to mention a few examples), the gap or break between downlink (DL) transmissions and uplink (UL) transmissions may be on the order of 10 microseconds. Regardless of the actual values of the settling times and the values of the gaps/breaks in transmissions, as the foregoing example demonstrates the settling times may be (substantially) longer than the gaps/breaks in the transmissions. As a result, the RF front end of a device (e.g., a base station) may be undergoing a change in value associated with a tunable component as a signal is being conveyed by/within a communication system; this change in value may generate a phase disturbance and/or an amplitude disturbance in the signal. At the very least, the phase disturbance and/or the amplitude disturbance represents a non-ideality (e.g., may introduce noise with respect to a received signal). In some embodiments, the phase disturbance and/or the amplitude disturbance might be unacceptable.

BRIEF DESCRIPTION OF THE DRAWINGS

Reference will now be made to the accompanying drawings, which are not necessarily drawn to scale, and wherein:

FIGS. 12-13 depict illustrative embodiments of look-up tables that can be utilized by the communication device of FIG. 6;

DETAILED DESCRIPTION

Figure 1:
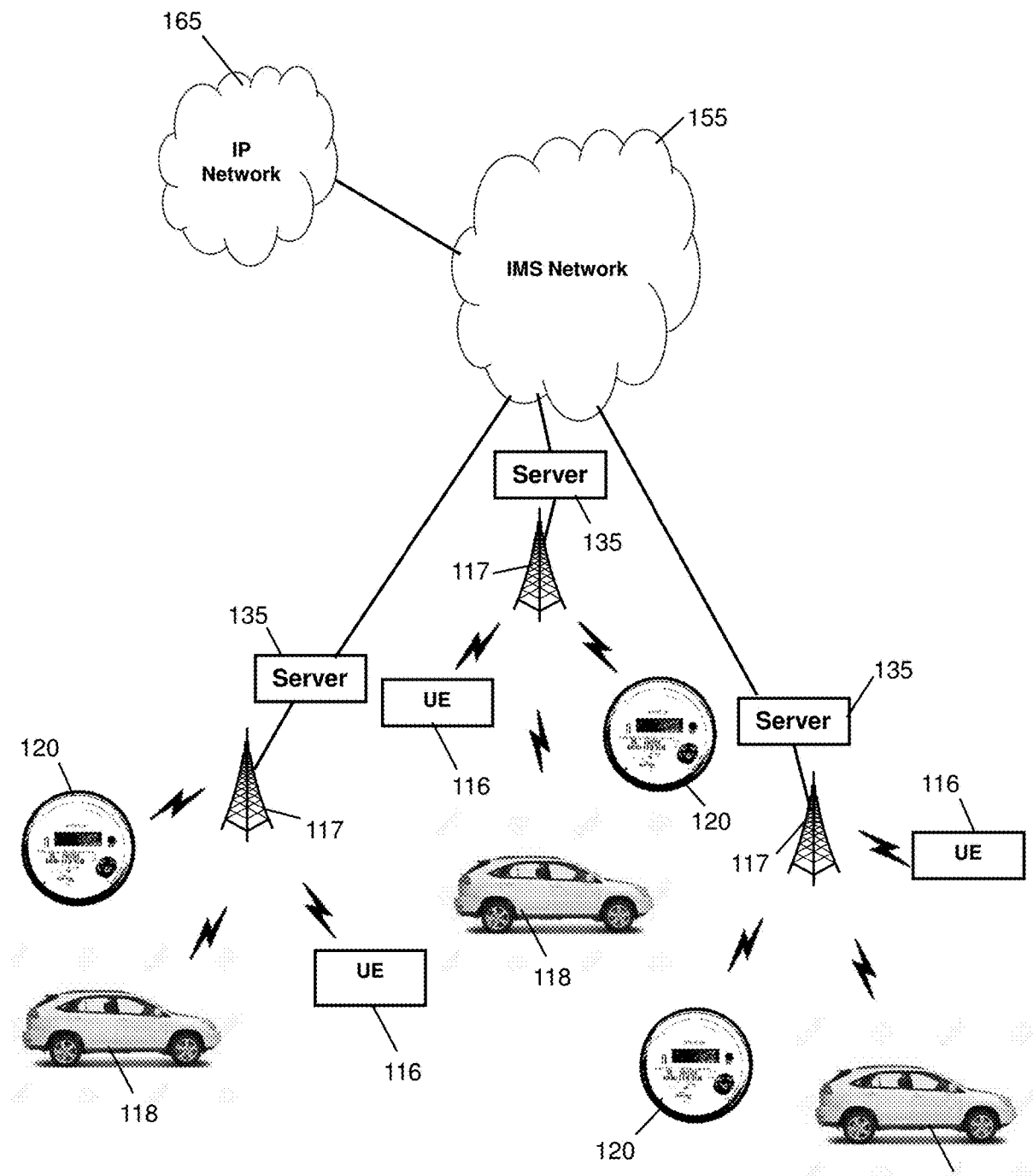
FIG. 1 depicts an illustrative embodiment of a system that can be utilized for managing network resources in a wireless communication network.

The subject disclosure describes, among other things, illustrative embodiments for mitigating settling times of tunable components (e.g., tunable capacitors) in a matching circuit or network of a system (e.g., a TDD system). The mitigation of settling times may reduce (e.g., prevent) tunable network impedance changes during a conveyance of signals in the system. Other embodiments are described in the subject disclosure.

One or more aspects of the subject disclosure include, in whole or in part, identifying a change in a value of a parameter associated with an antenna, determining a change in an impedance of the antenna based on the identifying of the change in the value of the parameter, identifying a change to a value of a first tunable component of a tuner that is to be enacted based on the determining of the change in the impedance of the antenna, the change to the value of the first tunable component that is to be enacted corresponding to a change in value from a first value to a second value, changing the value of the first tunable component from the first value to a third value during a first break in transmissions during a communication session that utilizes the antenna, wherein the third value is between the first value and the second value, and changing the value of the first tunable component from the third value to another value during a second break in transmissions during the communication session, wherein the first break and the second break are non-contiguous.

One or more aspects of the subject disclosure include, in whole or in part, identifying a change in a value of an impedance associated with an antenna, identifying a number of non-contiguous stages over which to change a value of a tunable component coupled to the antenna based on the identifying of the change in the value of the impedance associated with the antenna, wherein each of the stages corresponds to a break in communication involving the antenna, changing the value of the tunable component from a first value to a second value during a first stage of the non-contiguous stages, and changing the value of the tunable component from the second value to a third value during a second stage of the non-contiguous stages, wherein the second stage occurs subsequent to the first stage.

One or more aspects of the subject disclosure include, in whole or in part, changing a value of a tunable component coupled to an antenna of a base station from a first value to a second value during a first stage, and changing the value of the tunable component from the second value to a third value during a second stage that occurs subsequent to the first stage, wherein during each of the first stage and the second stage the antenna is not utilized for communication purposes, wherein the first stage and the second stage are separated from one another by a first active region, and wherein during the first active region a transmitter of the base station causes a first signal to be transmitted from the antenna for communication purposes.

One or more aspects of the subject disclosure include, in whole or in part, identifying a change in a parameter value associated with an antenna, determining a change in an impedance of the antenna based on the identifying of the change in the parameter value, identifying a change to a tuning value of a first tunable component of a tuner that is to be enacted based on the determining of the change in the impedance of the antenna, the change to the tuning value of the first tunable component that is to be enacted corresponding to a change in the tuning value from a first tuning value to a second tuning value, changing the tuning value of the first tunable component from the first tuning value to a third tuning value during a first transition between states of transmission during a communication session that utilizes the antenna, wherein the third tuning value is between the first tuning value and the second tuning value, and changing the tuning value of the first tunable component from the third tuning value to another tuning value during a second transition between the states of transmission during the communication session, wherein the first transition and the second transition are non-contiguous.

One or more aspects of the subject disclosure include, in whole or in part, identifying a change in a value of an impedance associated with an antenna, identifying a number of non-contiguous stages over which to change a tuning value of a tunable component coupled to the antenna based on the identifying of the change in the value of the impedance associated with the antenna, wherein each of the stages corresponds to a ceasing of wireless transmissions via the antenna, changing the tuning value of the tunable component from a first tuning value to a second tuning value during a first stage of the non-contiguous stages, and changing the tuning value of the tunable component from the second tuning value to a third tuning value during a second stage of the non-contiguous stages, wherein the second stage occurs subsequent to the first stage.

One or more aspects of the subject disclosure include, in whole or in part, changing a tuning value of a tunable component coupled to an antenna from a first tuning value to a second tuning value during a first stage, and changing the tuning value of the tunable component from the second tuning value to a third tuning value during a second stage that occurs subsequent to the first stage, wherein during each of the first stage and the second stage the antenna is not utilized by a transmitter for communication purposes, wherein the first stage and the second stage are separated from one another by a first active region, and wherein during the first active region the transmitter causes a first signal to be transmitted from the antenna for communication purposes.

Aspects of this disclosure may be implemented in conjunction with one or more communication devices, such as for example one or more base stations of one or more communication systems. In some embodiments, methodological acts/activities may be facilitated by a performance of one or more operations. The operations, in turn, may be performed in conjunction with an execution of one or more instructions by one or more processors of a processing system.

Aspects of this disclosure may adhere/conform to one or more communication techniques, standards, and/or protocols. For example, in some embodiments a communication session may correspond to TDD based communication session.

FIG. 1 depicts an illustrative embodiment of a system that can be utilized as part of a communication network. In one or more embodiments, the system 100 can incorporate a subscription-based, mobile communication service into a wireless communication network. In this system 100, an internet protocol multimedia subsystem (IMS) network 155 can be used to route telecommunication services and/or data services for client devices/user equipment (UE) 116.

The system 100 can include a network of base stations 117 that provide radio frequency (RF) communication links between servers 135 and UEs 116. The UEs 116 can perform two-way communications, as well as two-way data communications, through the IMS network 155 by way of these RF communication links. In some embodiments, the communications that are supported by the base stations 117 may incorporate aspects/principles of TDD communications.

The UEs 116 can access public internet protocol (IP) networks 165, which can, in turn, deliver content to the UEs 116 through the base stations 117. The system 100 (e.g., the base stations 117) can support wireless communications with vehicle-based, mobile communication devices 118 and stationary, wireless communication devices 120, such as Internet of Things (IoT) meters and/or sensors, and other wireless devices.

In one or more embodiments, the system 100 (e.g., the base stations 117) can provide services for a variety of devices 116, 118, and 120, each having its own device and usage characteristics that make differing demands on resources of the system 100. Each of the different device types can utilize one or more radio access technologies (RATs), a level of bandwidth, and/or latency. For example, and as described above, TDD communications of the present disclosure may incorporate a gap or break between downlink (DL) transmissions (e.g., transmissions from a base station 117 to a UE 116) and uplink (UL) transmissions (e.g., transmissions from a UE 116 to a base station 117).

Figure 2:
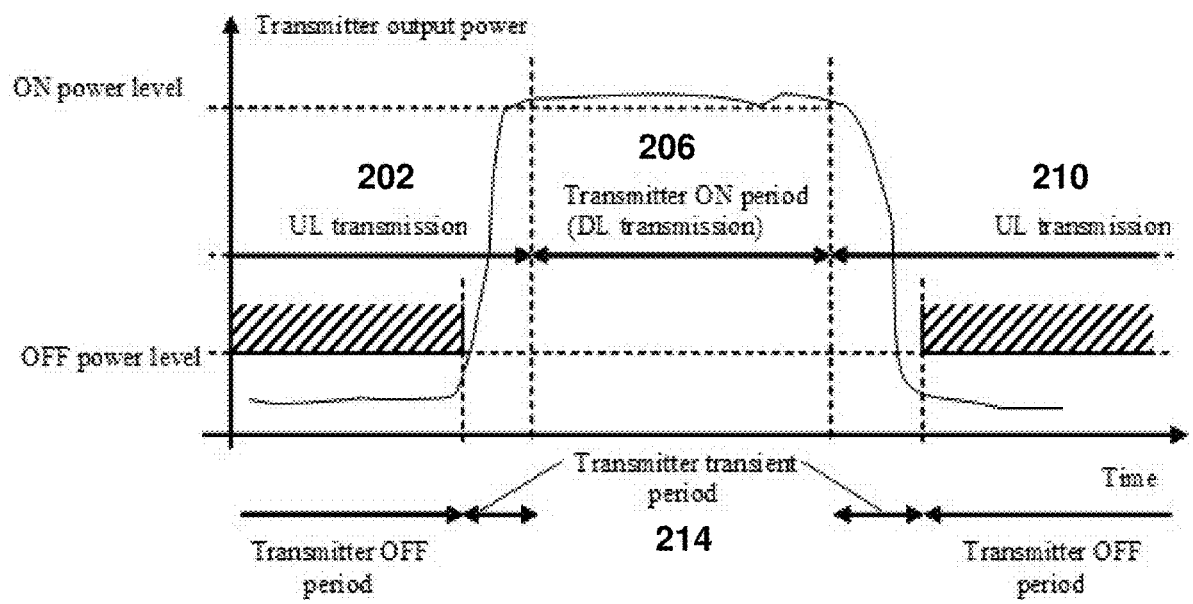
FIG. 2 depicts an illustrative plot/graph of transmission power versus time in a communication system in accordance with aspects of this disclosure.

To demonstrate, FIG. 2 illustrates a plot/graph 200 of transmitter output power (on the vertical axis) versus time (on the horizontal axis). The time/horizontal axis is further divided into three active stages or regions: a first region 202 associated with a first UL transmission, a second region 206 associated with a DL transmission, and a third region 210 associated with a second UL transmission. The use of three regions in FIG. 2 is illustrative; in many embodiments, more than three such regions may be used/included. The alternating sequence of UL and DL regions may be indicative of time slots that are assigned to devices (e.g., base stations, UEs, etc.) as part of TDD communications.

Between each pair of the regions 202-210 there may exist a gap/break, denoted in FIG. 2 as transmitter transient periods 214. These gaps/breaks 214 may correspond to a lack of any transmissions between two or more devices engaged in one or more communications/communication sessions with one another. For example, and referring to FIGS. 1-2, the gap 214 between the first region 202 and the second region 206 may correspond to the time between when a transmitter of a UE 116 is turned off and a time when a transmitter of a base station 117 is turned on. The gaps/breaks 214 may correspond to transitions between states of transmission during a communication session.

The gaps/breaks 214 of FIG. 2 may be as short as 10 microseconds in some embodiments. In some embodiments, the gaps/breaks 214 may be shorter than 10 microseconds. Regardless of the value/duration of the gaps/breaks 214 in a given embodiment, changes in impedance matching networks/circuits may be made during the gaps/breaks 214 in accordance with aspects of this disclosure. As described in further detail below, changes in impedance matching networks/circuits may be prevented/prohibited in time periods that are outside of the gaps/breaks 214 in accordance with aspects of this disclosure.

Figure 3:
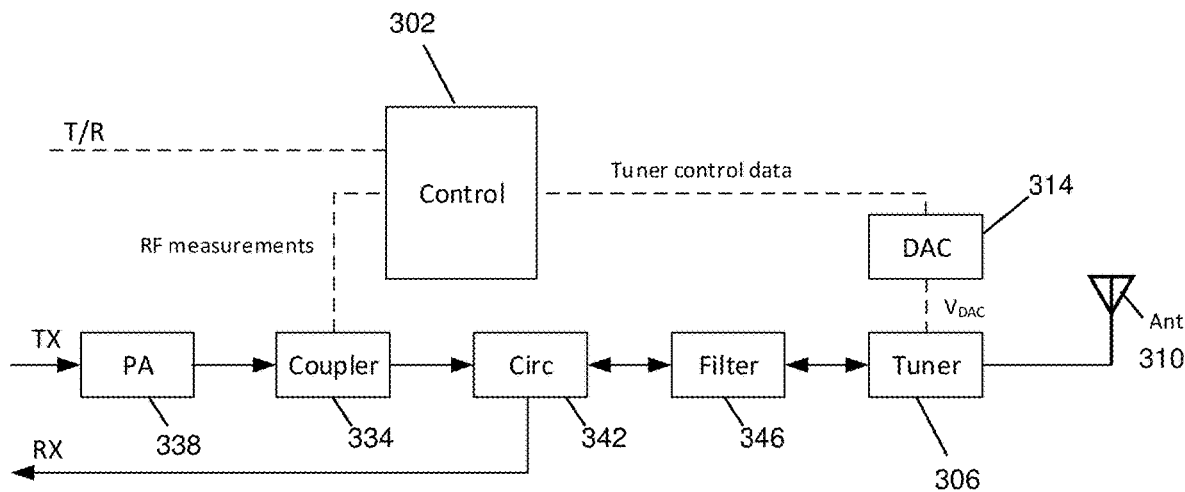
FIG. 3 depicts an illustrative embodiment of an impedance matching system in accordance with aspects of this disclosure.

Referring now to FIG. 3, an impedance matching network/system 300 in accordance with aspects of this disclosure is shown. The system 300 may be implemented via, or include, one or more circuits. The system 300 may include hardware, software, firmware, or any combination thereof. In some embodiments, the system 300 may be included as part of an RF front end of one or more devices, such as for example one or more base stations. In some embodiments, one or more devices of the system 300 (where the devices are described in further detail below) may be implemented as an integrated circuit, a chip, or the like. In some embodiments, one or more of the devices of the system 300 may be included/incorporated as part of one or processors or processing systems, such as for example a baseband processor.

The system 300 may include a control/controller 302. The controller 302 (which may include one or more processors) may control parameters and/or components of the system 300. For example, the controller 302 may generate and/or provide/output tuner control data that may control a value associated with a component of a tuner 306. The tuner 306 may include one or more tunable components, such as for example one or more tunable capacitors. The tunable component(s) of the tuner 306 may be adjusted, in accordance with the tuner control data, to provide for impedance matching in the tuner 306 relative to one or more other components, such as for example an antenna (Ant) 310.

As one skilled in the art will appreciate, the antenna 310 may be used in the transmission and/or reception of one or more signals (e.g., one or more wireless signals). The impedance of the antenna 310 may change due to one or more factors or conditions, such as environmental factors, frequency changes and/or loading. Thus, changes to tuning values of the (tunable components of the) tuner 306, and thus the impedance of the tuner 306, may be desired to match changes in the impedance of the antenna 310.

In some embodiments, the tuner control data generated and output by the controller 302 may correspond to, or include, one or more digital signals. For example, in some embodiments the tuner control data may incorporate aspects of serial communications, such as serial peripheral interface (SPI) communications and/or MIPI specifications for RF front-end control interface (RFFE). In these and other embodiments, a digital to analog converter (DAC) 314 may be included to convert/transform the tuner control data output by the controller 302 to analog values, e.g., analog voltages (denoted in FIG. 3 as $V_{DAC}$), that may be utilized by the tuner 306. For example, the analog voltage $V_{DAC}$ may be used as a bias voltage that may control a value of a capacitance associated with a tunable capacitor of the tuner 306. A time from when the controller 302 outputs the tuner control data until a tunable component (e.g., a tunable capacitor) of the tuner 306 assumes a value associated with the tuner control data (or is within a threshold thereof) may be indicative/representative of a settling time described above.

The controller 302 may obtain as inputs a transmit/receive (T/R) selector and/or one or more RF measurements associated with one or more signals (illustratively shown in FIG. 3 as being obtained from a coupler 334). These inputs may be representative of control lines and/or data that may be obtained from another source. As the nomenclature suggests, the T/R selector may be used by the controller 302 to select between controlling parameters associated with transmission by the system 300 versus controlling parameters associated with reception by the system 300.

The system 300 may include a power amplifier (PA) 338 that may amplify one or more signals that may be transmitted by the system 300 (e.g., may amplify one or more signals that may be transmitted by the antenna 310). The system 300 may include a circulator 342 that may provide separation between transmissions/transmitted signals and receptions/received signals. The system 300 may include a filter 346 that may reduce (e.g., remove) unwanted characteristics (e.g., frequency components) in one or more signals.

Figure 4A:
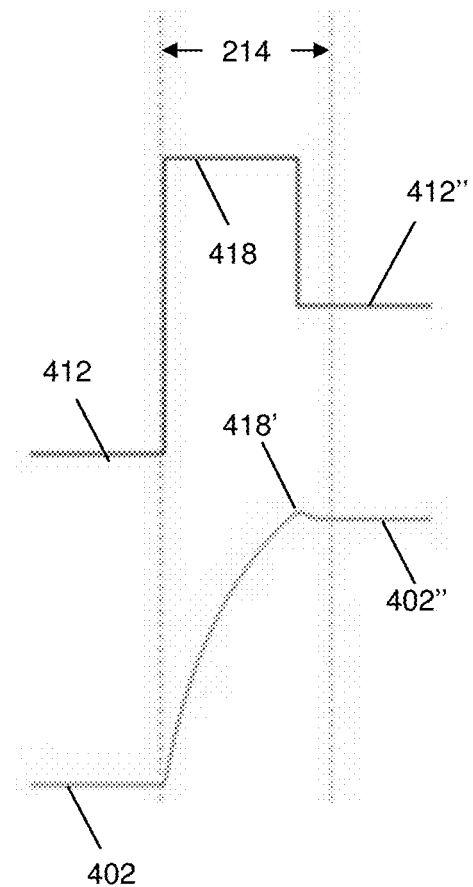
FIGS. 4A-4B depict a transition in a value of a tunable component in multiple stages in accordance with aspects of this disclosure.
Figure 4B:
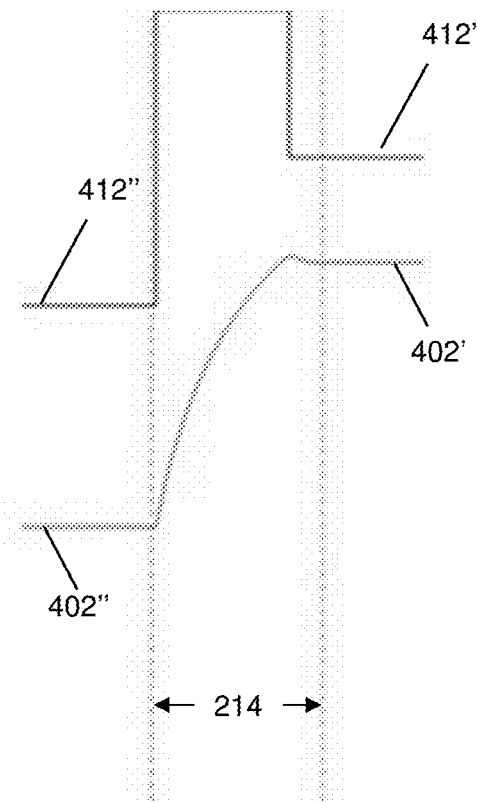

The system 300 may be operative to change a tuning value of a tunable component (e.g., a tunable capacitor) of the tuner 306 in multiple steps/stages from a first, initial tuning value to a second, final/target tuning value, with one or more intermediate tuning values present/disposed between the first tuning value and the second tuning value. To demonstrate, taken collectively FIGS. 4A-4B illustrate a change in a tuning value of a tunable component from a first, initial tuning value 402 to a second, target tuning value 402'. FIG. 4A may be representative of a first stage, and FIG. 4B may represent a second stage that occurs subsequent to the first stage. At the conclusion of the first stage, and at the start of the second stage, the tunable component may have a third, intermediate tunning value 402" that may be between the first, initial tuning value 402 and the second, target tuning value 402'.

Each of the first stage and the second stage of FIGS. 4A-4B may be associated with a respective gap/break in transmissions (e.g., may be associated with respective transitions between states of transmission, such as wireless transmission) in a communication system. For example, the first stage of FIG. 4A may be associated with the left-most gap 214 (between/bordering the regions 202 and 206) shown in FIG. 2 and the second stage may be associated with the right-most gap 214 (between/bordering the regions 206 and 210) shown in FIG. 2. In this regard, transmission may cease during the gaps/breaks.

Also shown in FIGS. 4A-4B are values 412, 412', and 412" of the output voltage $V_{DAC}$ of the DAC 314 of FIG. 3 (or, analogously, the values of the tuner control data output by the controller 302 of FIG. 3) that may be used to realize the tuning values 402, 402', and 402" of the tunable component of the tuner 306, respectively.

As shown in FIGS. 2, 3, and 4A-4B, within a given stage or break 214, more than one value of the voltage $V_{DA}c$ may be commanded/facilitated by the controller 302. For example, as shown in FIG. 4A, during the first stage the voltage $V_{DAC}$ may obtain a value 418 that is different from (e.g., greater than) the value 412" of $V_{DAC}$ that is present at the end/conclusion of the first stage. The difference between the values 418 and 412" of the voltage $V_{DAC}$ may result in the lip/bump 418' in the tuning value of the tunable component. The change in values during the first stage from the value 418 to the value 412" may allow the tunable component (e.g., the tunable capacitor) of the tuner 306 to stop changing and settle prior to the next transmission in the communication system starting at the end/conclusion of the first stage.

As FIGS. 2 and 4A-4B demonstrate, tuning values of a tunable component may be modified/altered during gaps/breaks/transitions 214 in transmissions of a communication system. When transmissions are potentially ongoing/active in the communication system (as illustrated by, e.g., the active stages/regions 202, 206, and 210 in FIG. 2), tuning values of the tunable component might not be modified/altered (e.g., tuning values of the tunable component may remain stable/stationary/stagnant/constant during ongoing/active transmission periods/regions/stages of the communication system). In this respect, and as a result of a lack of change of a tuning value of a tunable component during the active transmission periods, signal degradation (e.g., signal amplitude and/or phase distortion) may be reduced (e.g., avoided/prevented), thereby enhancing a performance of the front end (e.g., RF) components of devices (e.g., base stations) of the communication system.

While the FIGS. 4A-4B illustrate the use of two stages to transition a tuning value of a tunable component from a first, initial tuning value 402 to a second, target/final tuning value 402', in some embodiments more than two stages may be utilized. The count/number of stages that may be utilized may be a function of: a range of tunning values that a tunable component may assume, any time constants (e.g., RC time constants) that may be associated with the tunable component, the length/duration of any gaps that may be provided by/included in the communication system, or any combination thereof.

In accordance with aspects of this disclosure, a tuning of a tuning value of a component may be performed to facilitate impedance matching. Such tuning may be performed in conjunction with TDD carriers without tuning changes occurring during an active portion of the carrier. Aspects of the disclosure may subdivide tuner transitions into multiple stages, where each of the stages may be separated from one another in time. Stated slightly differently, the tuning changes may occur over multiple, non-contiguous time periods. These sub-state transitions may be implemented in time gaps/breaks (e.g., transient/transition gaps) in a TDD frame structure having a time duration that is shorter than the time required for a complete tuner transition from a current, initial state to target, final state, thus accomplishing the complete tuner transition over multiple transient gaps/breaks. The sub-state values may be selected such that each of the values can fit in its respective transient gap and they each do not contribute negatively to the overall RF signal quality (e.g., do not impact RF signal quality in an amount greater than a threshold).

As described herein, aspects of this disclosure may be implemented in connection with one or more devices or components of a communication system. For example, aspects of this disclosure may facilitate the use of an impedance control network for 2.6 GHz TDD base station applications/environments.

Figure 5:
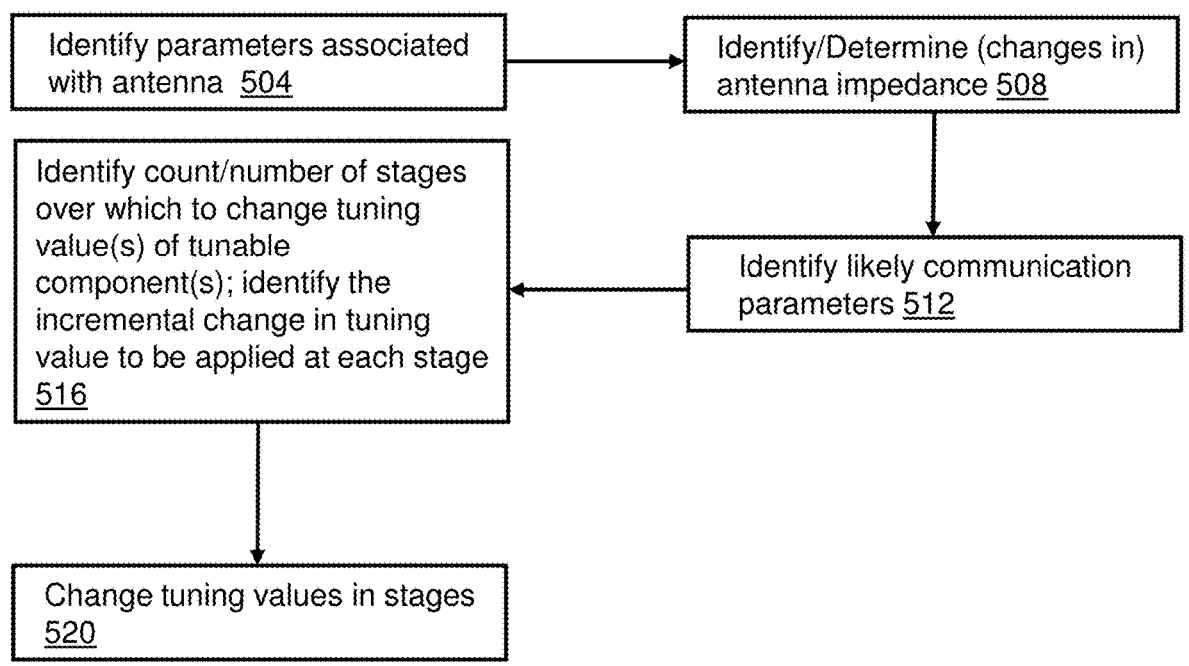
FIG. 5 depicts an illustrative embodiment of a method in accordance with aspects of this disclosure.

Referring now to FIG. 5, a flowchart of an exemplary method 500 in accordance with one or more embodiments of this disclosure is shown. The method 500 may be partially or wholly executed by one or more systems, devices, and/or components, such as for example the systems, devices, and components described herein. The method 500 may be utilized to modify/alter a tuning value of a tunable component, such as a tunable capacitor, in multiple stages.

In block 504, one or more parameters associated with one or more antennas may be identified. For example, the parameters identified in block 504 may include environmental factors (e.g., ambient weather conditions, identifications of obstacles or objects present or absent in a communication path between two or more devices, where the obstacle or object may interfere with wireless communications), frequency changes (e.g., changes in frequencies of signals supported by an antenna) and/or loading (e.g., an amount of communication traffic supported by an antenna). As part of block 504, values for the one or more parameters may be determined or identified. As part of block 504, changes in parameter values of one or more of the parameters may be determined or identified.

In block 508, one or more values of an impedance associated with the one or more antennas may be identified or determined. The values may be identified/determined/expressed as absolute values and/or may be identified/determined/expressed on a relative basis (e.g., may be expressed as a change in value relative to a baseline or reference value).

In block 512, parameters associated with communications likely to be supported by the antenna(s) may be identified. For example, as part of block 512, a historical record/log of communication sessions involving the antenna(s) may be accessed/consulted, where such communication sessions may be predictive of future communication sessions. As part of block 512, a schedule (e.g., a calendar) of one or more users may be consulted to identify likely communication sessions that may need to be supported by the antenna(s).

Based on one or more of the parameters identified in one or more of blocks 504-512, a determination may be made that a tuning value of one or more tunable components of a tuner (see, e.g., tuner 306 of FIG. 3) may need to be updated/modified. Furthermore, a determination may be made that the update/modification to the tuning value(s) of the tunable component(s) may need to occur over multiple stages. In this regard, and as part of block 516, a count/number of stages over which to change the tuning value(s) of the tunable component(s) may be identified. The incremental change(s) in the tuning value(s) to be applied at each stage may also be identified/selected as part of block 516, in order to ensure that any transition in tuning value is completed before the end of a given stage.

In block 520, changes in/to the tuning value(s) of the tunable component(s) identified as part of block 516 may be enacted in accordance with the stages identified in block 516. In this regard, and as described above, as part of block 520 the tuning values of the tunable component(s) may assume one or more intermediate tuning values between a first, initial tuning value and a second, final/target tuning value.

In some embodiments, changes to tuning values of multiple tunable components may be utilized during a given stage/break/transition in communications. For example, a first tuning value of a first tunable component may be updated/modified/changed in order to provide for a coarse level of tuning, and a second tuning value of a second tunable component may be updated/modified/changed in order to provide for a fine level of tuning. In this regard, an amount of change associated with the first tuning value may be different from (e.g., may be greater than) an amount of change associated with the second tuning value.

In some embodiments, a tuner may include a switched capacitor network, where the capacitance value is altered by switching in (or out) capacitors within the network. In such embodiments, the "tunable capacitor" may be characterized by a finite number of discrete capacitance value steps.

Figure 6:
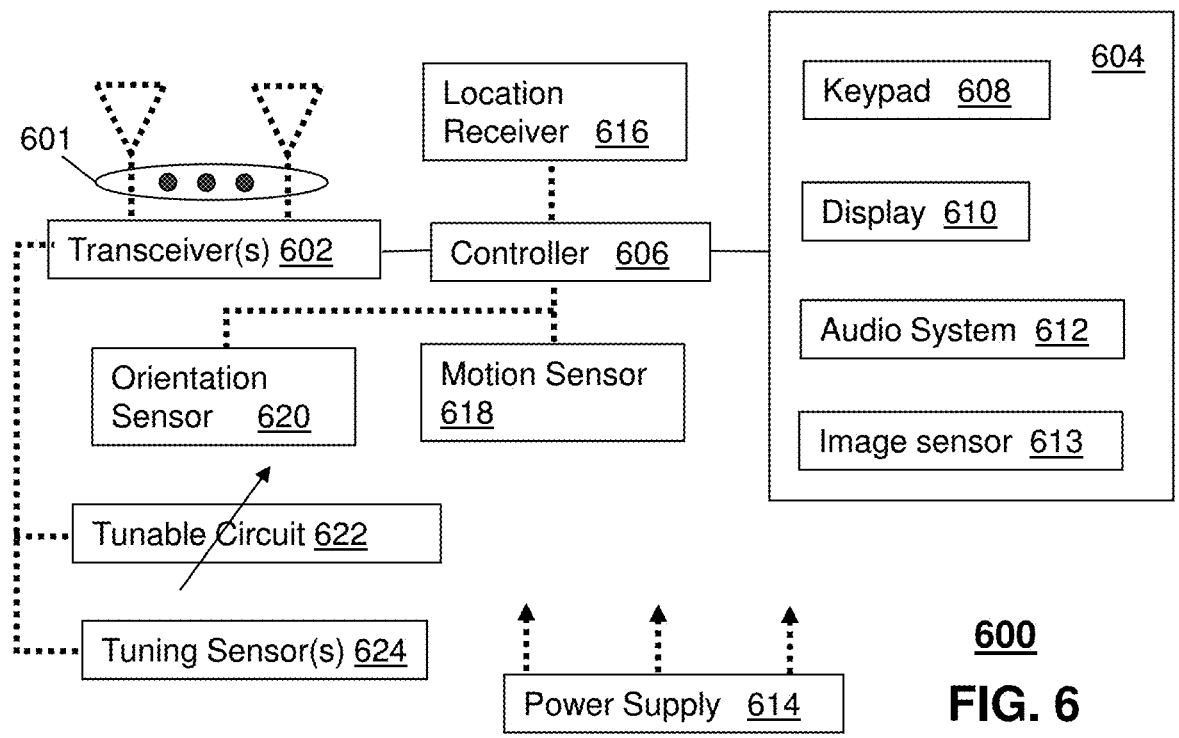
FIG. 6 depicts an illustrative embodiment of a communication device that can generate multiple tuning steps/stages to achieve a desired tuning value.

FIG. 6 depicts an illustrative embodiment of a communication device 600. Communication device 600 can include one or more antennas 601 coupled with a controller 606 that can determine a desired tuning step or value and which can generate a group of tuning steps to achieve the desired tuning value. The group of tuning steps can be determined or otherwise selected so as to satisfy operational criteria to reduce or eliminate undesired conditions during tuning. The operational criteria can include, among other requirements, a maximum allowable phase shift and/or a maximum allowable amplitude shift. The communication device 600 can comprise one or more transceivers 602 coupled to the antenna 601 (each transceiver having transmitter and receiver sections (herein transceiver 602)), a tunable circuit or matching network 622, one or more tuning sensors 624, a user interface (UI) 604, a power supply 614, a location receiver 616, a motion sensor 618, an orientation sensor 620, and the controller 606 for managing operations thereof. The tuning sensor(s) 624 can be used for detecting the operational parameters associated with the antenna 601 and/or detecting other operational parameters that can be used in a tuning algorithm. The transceiver 602 can support short-range or long-range wireless access technologies such as Bluetooth, ZigBee, WiFi, DECT, or cellular communication technologies, just to mention a few. Cellular technologies can include, for example, CDMA-1X, UMTS/HSDPA, GSM/GPRS, TDMA/EDGE, EV/DO, WiMAX, SDR, LTE, as well as other next generation wireless communication technologies (3G, 4G, 5G, 6G, etc.) as they arise. The transceiver 602 can also be adapted to support circuit-switched wireline access technologies (such as PSTN), packet-switched wireline access technologies (such as TCP/IP, VoIP, etc.), and combinations thereof.

The tunable circuit 622 can comprise variable reactive elements such as variable capacitors, variable inductors, or combinations thereof that are tunable with digital and/or analog bias signals based in part on the selected group of tuning steps that satisfy the operational criteria and that achieve the desired tuning value in a desired amount of time (e.g., within a single frame). The tunable circuit 622 can represent a tunable matching network coupled to the antenna(s) 601 to compensate for a change in impedance of the antenna(s) 601, a compensation circuit to compensate for mutual coupling in a multi-antenna system, an amplifier tuning circuit to control operations of an amplifier of the transceiver 602, a filter tuning circuit to alter a pass band of a filter of the transceiver 602, and so on. The tuning sensors 624 can be placed at any stage of the transceiver 602 such as before or after a matching network 702 shown in FIG. 7. The tuning sensors or detectors 624 can utilize any suitable sensing technology or components including directional couplers, voltage dividers, or other sensing technologies to measure signals at any stage of the transceiver 602. The measured signals can be provided to the controller 606 by way of analog-to-digital converters included in the tuning sensors 624 for processing and tuning a variable reactance of the tunable circuit 622.

The UI 604 can include a depressible or touch-sensitive keypad 608 with a navigation mechanism such as a roller ball, a joystick, a mouse, or a navigation disk for manipulating operations of the communication device 600. The keypad 608 can be an integral part of a housing assembly of the communication device 600 or an independent device operably coupled thereto by a tethered wireline interface (such as a USB cable) or a wireless interface supporting, for example, Bluetooth. The keypad 608 can represent a numeric keypad commonly used by phones, and/or a QWERTY keypad with alphanumeric keys. The UI 604 can further include a display 610 such as monochrome or color LCD (Liquid Crystal Display), OLED (Organic Light Emitting Diode) or other suitable display technology for conveying images to an end user of the communication device 600. In an embodiment where the display 610 is touch-sensitive, a portion or all of the keypad 608 can be presented by way of the display 610 with navigation features.

The display 610 can use touch screen technology to also serve as a user interface for detecting user input. As a touch screen display, the communication device 600 can be adapted to present a user interface with graphical user interface (GUI) elements that can be selected by a user with a touch of a finger. The touch screen display 610 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 610 can be an integral part of the housing assembly of the communication device 600 or an independent device communicatively coupled thereto by a tethered wireline interface (such as a cable) or a wireless interface. In one or more embodiments, the GUI can enable a user to input information that facilitates determining the desired tuning value, such as providing a present use case.

The UI 604 can also include an audio system 612 that utilizes audio technology for conveying low volume audio (such as audio heard in proximity of a human ear) and high volume audio (such as speakerphone for hands free operation). The audio system 612 can further include a microphone for receiving audible signals of an end user. The audio system 612 can also be used for voice recognition applications. The UI 604 can further include an image sensor 613 such as a charged coupled device (CCD) camera for capturing still or moving images.

The power supply 614 can utilize common power management technologies such as replaceable and rechargeable batteries, supply regulation technologies, and/or charging system technologies for supplying energy to the components of the communication device 600 to facilitate long-range or short-range portable applications. Alternatively, or in combination, the charging system can utilize external power sources such as DC power supplied over a physical interface such as a USB port or other suitable tethering technologies.

The location receiver 616 can utilize location technology such as a global positioning system (GPS) receiver capable of assisted GPS for identifying a location of the communication device 600 based on signals generated by a constellation of GPS satellites, which can be used for facilitating location services such as navigation. The motion sensor 618 can utilize motion sensing technology such as an accelerometer, a gyroscope, or other suitable motion sensing technology to detect motion of the communication device 600 in three-dimensional space. The orientation sensor 620 can utilize orientation sensing technology such as a magnetometer to detect the orientation of the communication device 600 (north, south, west, and east, as well as combined orientations in degrees, minutes, or other suitable orientation metrics).

The communication device 600 can use the transceiver 602 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements. The controller 606 can utilize computing technologies such as a microprocessor, a digital signal processor (DSP), and/or a video processor with associated storage memory such as Flash, ROM, RAM, SRAM, DRAM or other storage technologies for executing computer instructions, controlling, and processing data supplied by the aforementioned components of the communication device 600.

Other components not shown in FIG. 6 are contemplated by the subject disclosure. The communication device 600 can include a slot for inserting or removing an identity module such as a Subscriber Identity Module (SIM) card. SIM cards can be used for identifying and registering for subscriber services, executing computer programs, storing subscriber data, and so forth. The communication device 600 as described herein can operate with more or less of the circuit components shown in FIG. 6. It is further noted that communication device 600 be an integral part of consumer or industrial devices, such as computers, laptops, tablets, utility meters, telemetry measurement devices, and so on.

In one or more embodiments, the controller 606 can perform antenna tuning for the antenna 601 (via adjusting the matching networks 622) based on a use case. The use case can be utilized in an open-loop tuning algorithm (e.g., selecting tuning values for one or more variable reactances based on a look up table or other stored values mapped to the use case) and/or can be utilized in conjunction with a closed-loop algorithm (e.g., the use case can be a parameter of the algorithm that also relies upon operational parameters of the communication device, such as output power of the transmitter, return loss, received power, current drain and/or transmitter linearity). In one or more embodiments, the pre-defined tuning states, which are mapped to the use cases, can be determined during product development or manufacture based on empirical data and can be used as the desired tuning value. For example, empirical data can be stored in a look-up table that is based on a desired total radiated power (TRP) and/or total isotropic sensitivity (TIS), and which can be indexed based on use cases. In this example, the empirical data can be obtained through testing under various conditions, including under various use cases. In another embodiment, the empirical data can be indexed (e.g., in combination with the use cases) based on other factors including operating frequency, device mode of operation, device operating metrics, and so forth. In another embodiment, the empirical data of the look-up table can be based on desired UL and/or DL throughput, which can be indexed based on use cases. This process enables the communication device 600 to determine a desired tuning step or value and then to break the desired tuning step or value into a group of tuning steps to avoid undesired conditions that can occur when impedance tuning is performed to rapidly.

Figure 7:
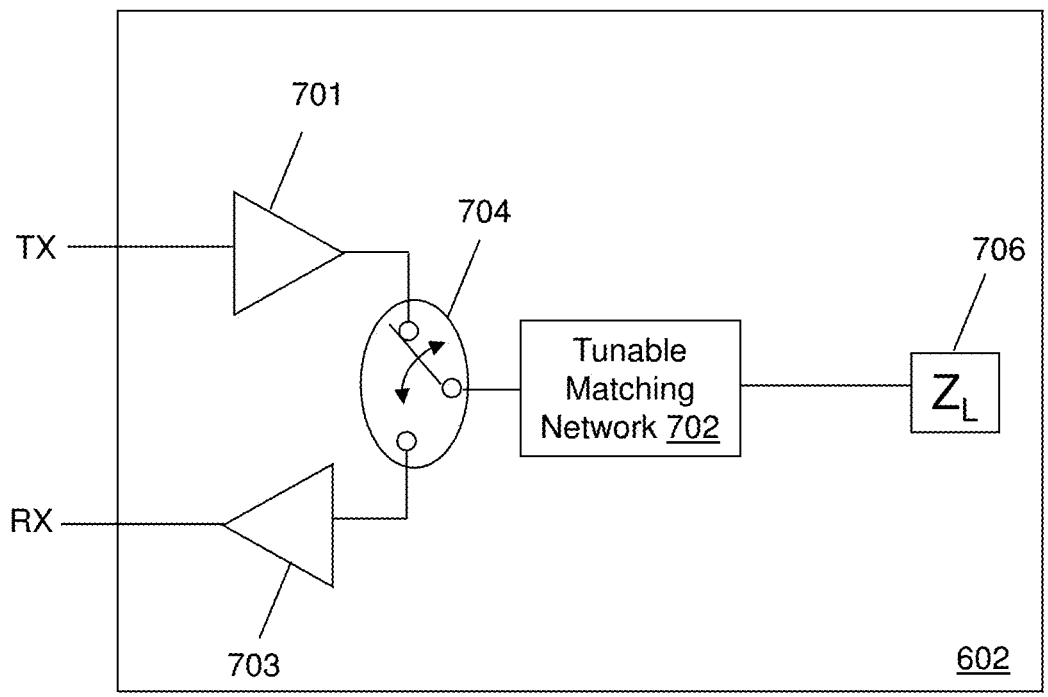
FIG. 7 depicts an illustrative embodiment of a portion of a transceiver of the communication device of FIG. 6.

FIG. 7 depicts an illustrative embodiment of a portion of the wireless transceiver 602 of the communication device 600 of FIG. 6. In one embodiment, such as for GSM applications, the transmit and receive portions of the transceiver 602 can include amplifiers 701, 703 coupled to a tunable matching network 702 and an impedance load 706 by way of a switch 704. The load 706 in the present illustration can include the antenna as shown in FIG. 6 (herein antenna 706). A transmit signal in the form of a radio frequency (RF) signal (TX) can be directed to the amplifier 701 which amplifies the signal and directs the amplified signal to the antenna 706 by way of the tunable matching network 702 when switch 704 is enabled for a transmission session. The receive portion of the transceiver 602 can utilize a pre-amplifier 703 which amplifies signals received from the antenna 706 by way of the tunable matching network 702 when switch 704 is enabled for a receive session. Other configurations of FIGS. 6-7 are possible for other types of cellular access technologies, such as CDMA. These undisclosed configurations are contemplated by the present disclosure.

Figure 8:
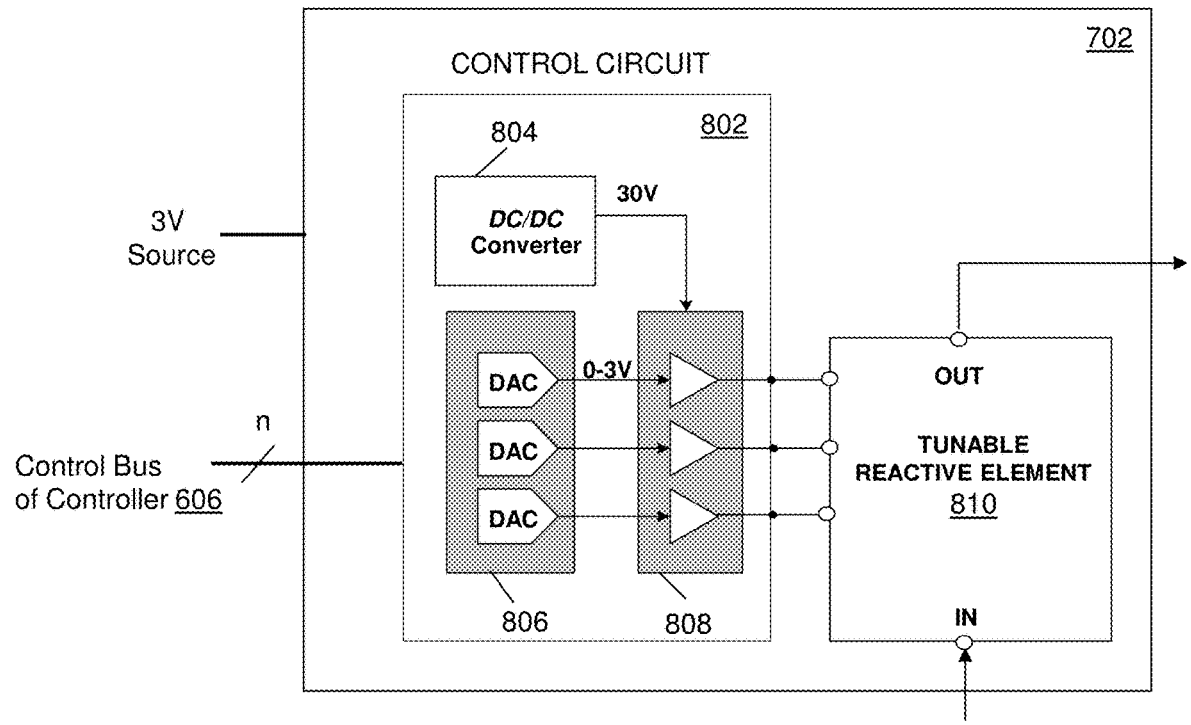
FIGS. 8-9 depict illustrative embodiments of a tunable matching network of the transceiver of FIGS. 6-7.
Figure 9:
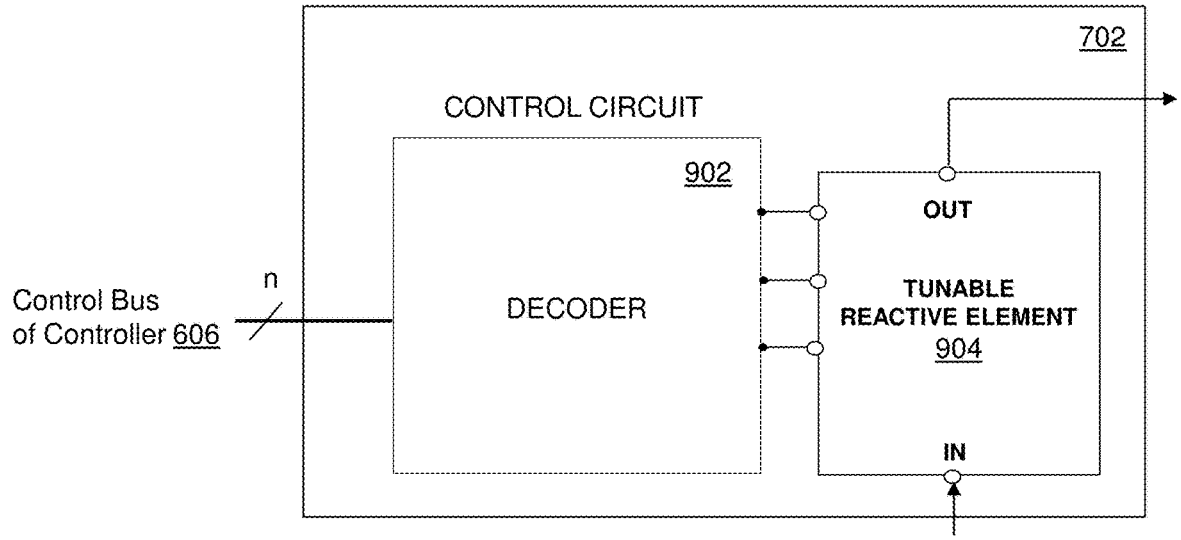
Figure 10:
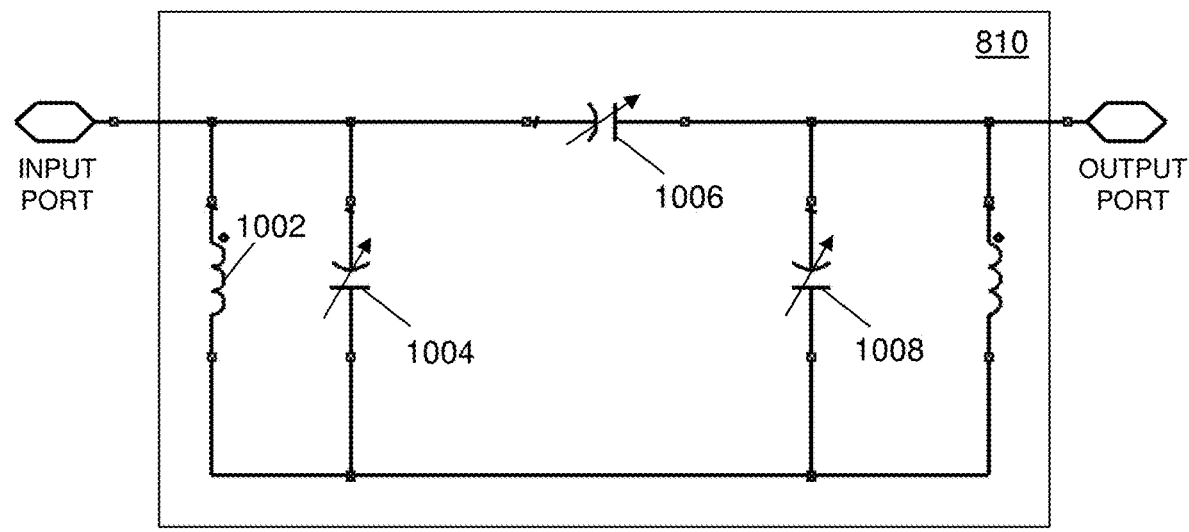
FIGS. 10-11 depict illustrative embodiments of a tunable reactive element of the tunable matching network of FIGS. 8-9.

FIGS. 8-9 depict illustrative embodiments of the tunable matching network 702 of the transceiver 602 of FIGS. 6-7. In one embodiment, the tunable matching network 702 can comprise a control circuit 802 and a tunable reactive element 810. The control circuit 802 can comprise a DC-to-DC converter 804, one or more digital to analog converters (DACs) 806 and one or more corresponding buffers 808 to amplify the voltage generated by each DAC. The amplified signal can be fed to one or more tunable reactive components 1004, 1006 and 1008 such as shown in FIG. 10, which depicts a possible circuit configuration for the tunable reactive element 810. In this illustration, the tunable reactive element 810 includes three tunable capacitors 1004, 1006, 1008 and an inductor 1002 with a fixed inductance. Other circuit configurations are possible, including use of other components, and are thereby contemplated by the present disclosure.

The tunable capacitors 1004, 1006, 1008 can each utilize technology that enables tunability of the capacitance of said component. One embodiment of the tunable capacitors 1004, 1006, 1008 can utilize voltage or current tunable dielectric materials such as a composition of BST. An illustration of a BST composition is the Parascan® Tunable Capacitor. In another embodiment, the tunable reactive element 810 can utilize semiconductor varactors. Other present or next generation methods or material compositions that can support a means for a voltage or current tunable reactive element are contemplated by the present disclosure.

In some embodiments, each of tunable capacitors 1004, 1006, 1008 may have a tuning range of about 0.6 pF to about 3.2 pF, although the tuning range may be different, as well. The capacitance value of each of capacitors 1004, 1006, 1008 may be controllable by varying a bias voltage applied to the capacitor across a bias voltage range from about 1 volt to about 24 volts, although any of capacitors 1004, 1006, 1008 may be tunable across a different bias voltage range, as well. Based on the bias voltage provided, the capacitance value of the capacitor 1004, 1006, 1008 may be varied during two or more consecutive or non-consecutive communication gaps from an initial capacitance value to a target capacitance value. For example, it may be desirable to vary the capacitance value of capacitor 1004, 1006 or 1008 from an initial capacitance value of 1.2 pF to a target capacitance value of 2.7 pF over three consecutive or non-consecutive communication gaps. Prior to the first communication gap, the initial capacitance value may be established in the capacitor 1004, 1006 or 1008 by providing a first bias voltage within the bias voltage range. During the first communication gap, the bias voltage may be changed (e.g., raised or lowered) to change (e.g., increase or decrease) the capacitance value from the initial capacitance value to a first intermediate capacitance value. During a subsequent second communication gap, the bias voltage again may be changed (e.g., raised or lowered) to further change the capacitance value from the first intermediate capacitance value to a second intermediate capacitance value. Finally, during a subsequent third communication gap, the bias voltage again may be changed (e.g., raised or lowered) to even further change the capacitance value from the second intermediate capacitance value to the target capacitance value. In other examples, the capacitance value may be changed over only two communication gaps, or over more than three communication gaps.

The DC-to-DC converter 804 can receive a power signal, such as 3 Volts, from the power supply 614 of the communication device 600 in FIG. 6. The DC-to-DC converter 804 can use common technology to amplify this power signal to a higher range (e.g., 30 Volts) such as shown. The controller 606 can supply digital signals to each of the DACs 806 by way of a control bus of "n" or more wires to individually control the capacitance of tunable capacitors 1004, 1006, 1008, thereby varying the collective reactance of the tunable matching network 702. The control bus can be implemented with a two-wire common serial communications technology such as a Serial Peripheral Interface (SPI) bus. With an SPI bus, the controller 606 can submit serialized digital signals to configure each DAC 806 in FIG. 8 or components of the tunable reactive element 904 of FIG. 9. The control circuit 802 of FIG. 8 can utilize common digital logic to implement the SPI bus and to direct digital signals supplied by the controller 606 to the DACs.

Figure 11:
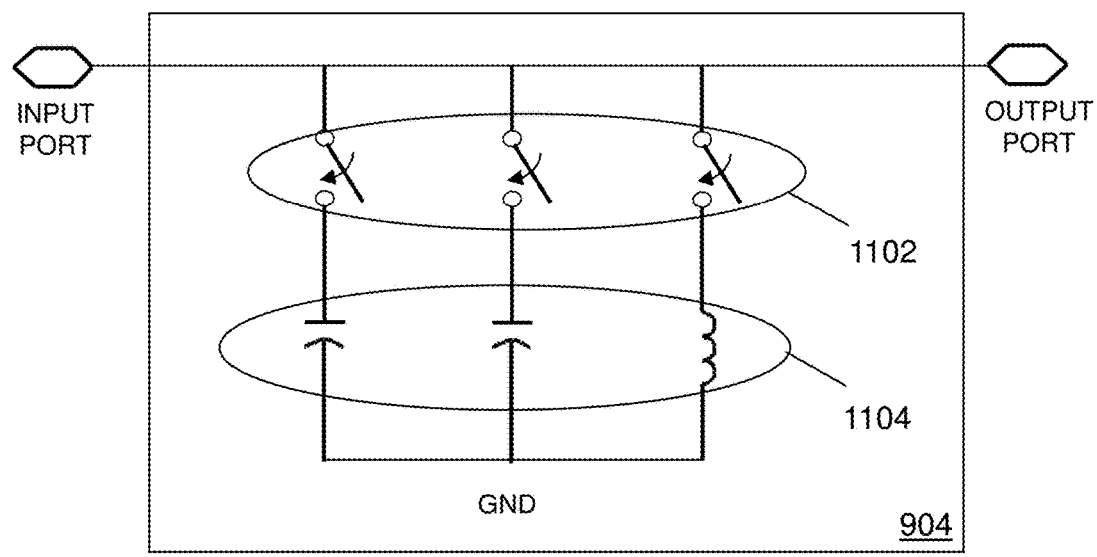

In another embodiment, the tunable matching network 702 can comprise a control circuit 902 in the form of a decoder and a tunable reactive element 904 comprising switchable reactive elements such as shown in FIG. 11. In this embodiment, the controller 606 can supply the control circuit 902 signals via the SPI bus which can be decoded with Boolean or state machine logic to individually enable or disable the switching elements 1102. The switching elements 1102 can be implemented using various types of switches, such as semiconductor switches or micro-machined switches including those utilized in micro-electro-mechanical systems (MEMS). By independently enabling and disabling the reactive elements (capacitors and/or inductors 1104) of FIG. 11 with the switching elements 1102, the collective reactance of the tunable reactive element 904 can be varied.

The tunability of the tunable matching network 702 provides the controller 606 a means to optimize performance parameters of the transceiver 602 such as, for example, but not limited to, transmitter power, transmitter efficiency, receiver sensitivity, power consumption of the communication device, a specific absorption rate (SAR) of energy by a human body, frequency band performance parameters, and so forth. To achieve one or more desirable performance characteristics which can be defined, the communication device 600 can utilize a tuning state selection method, such as depicted in FIG. 5.

Other algorithms can be used for selecting a desired tuning value, and which may resolve any inaccuracy in determining a particular use case that affects the antenna environment and resulting antenna performance. For instance, the radio frequency and/or other RF information (e.g., band and sub-band) can be determined, and one or more usage conditions or factors such as, for example, but not limited to, audio path configuration, user interface mode of operation, and radio bearer type, can be used to determine a number of tuning state candidates, which have the highest probability of matching the actual environment of the communication device. An example of this algorithm is described in U.S. Pat. No. 8,712,340, the contents of which are hereby incorporated by reference.

In one or more embodiments, the look-up table that includes the group of smaller tuning steps based on modulation types can be static and/or dynamic. For example, the look-up table can be pre-loaded into the memory of the communication device based on known or estimated factors including modulation type, use cases, usage conditions or factors, and so forth. In another example, the look-up table can be populated or adjusted based on values determined during operation of the communication device, such as from a remote source transmitting the data, including a base station.

In one embodiment, the desired tuning value can be determined based on RSSI, Received Signal Code Power (RSCP), Received Signal Quality (RXQUAL), Received Bit Error Rate, current drain, transmit power control level, and so forth as parameters to select a desired tuning value via a look-up table. In addition, feedback from a cellular base station can be utilized in the tuning process. For instance, if the handset is directed to transmit at a lower power step with one tuning state than another, that information could be utilized to determine which tuning state provides a better match for the handset transmitter. In one or more embodiments, the algorithm can set the tuning state and sample the parameter(s) resulting from that tuning state change. In one embodiment, at least one sample for each tuning state setting can be utilized. More samples may also be utilized in which case the sample order can be interleaved where n different possible tuning states can be set and RSSI or other parameter(s) measured for each, with each of the n states repeated m times. The resultant m measurements for each state can be then be averaged or otherwise processed in order to determine which tuning state will be chosen as the preferred state.

In one or more embodiments, the desired tuning step or value can be identified or otherwise determined based on various goals, such as one or more of a better pre-determined antenna match (e.g., 50Ω) for each radio Tx/Rx band, achieving better total radiated power/total isotropic sensitivity (TRP/TIS) in the various use cases (e.g., free space, handheld, and other limited modes of operation), a better or best Quality of Service (QoS) with a lower or lowest power consumption. For example, radiated UL throughput can be compared with a desired UL throughput (e.g., a throughput threshold), such as through use of RSSI measurement, to determine whether tuning is to be performed to improve or maintain the radiated UL throughput. One or more of the exemplary embodiments can take into account that an optimized TRP and/or TIS may not provide the best user experience and can determine the desired tuning step or value accordingly. In one or more embodiments, the best user experience can be defined by quality of service parameters, such as voice quality and/or data throughput. QoS may not be directly proportional or otherwise 100% related to TRP and TIS, which are just two variables of QoS function.

In one or more embodiments, the selection of the group of tuning steps is based on a look-up table (e.g., table 1200 of FIG. 12) that provides tuning information based on modulation type. The tuning information of table 1200 can include tuning limits and/or tuning steps that are indexed based on radio access technology and modulation type. For instance, table 1200 can indicate that the group of tuning steps for a 16QAM modulation type is to be limited by 12 degrees and 0.25 dB while the group of tuning steps for a 64QAM modulation type is to be limited by 5 degrees and 0.25 dB in order to avoid an undesired level of symbol error. In another example of table 1200, the table can indicate that the group of tuning steps for a 16QAM modulation type is to be limited by 10 degrees and 0.25 dB while the group of tuning steps for a 64QAM modulation type is to be limited by 6 degrees and 0.25 dB in order to avoid an undesired level of error vector magnitude. In one embodiment, multiple tables can be stored that are based on different undesired conditions (such as symbol error, error vector magnitude, bit error rate, adjacent channel leakage ratio, and so forth) and that are indexed based on modulation type. In another embodiment, a single table can be stored that provides for the most constrained limitation from amongst the undesired conditions so that the group of tuning steps can avoid all of the undesired conditions. In one or more embodiments, the tuning limits from table 1200 can be used in an algorithm that determines the group of tuning steps to be utilized in order to achieve the desired tuning value within a given time period (such as within a single slot). The algorithm can generate equal tuning steps that achieve these goals or can generate unequal steps (including distinguishing between the size of the steps based on various factors including gradually increasing the step size, taking larger steps initially, and so forth).

In this example, table 1200 includes empirical data for the operational criteria (e.g., the maximum allowable phase and amplitude shifts) which can be obtained through testing under various conditions, including using different modulation schemes and/or under various use cases. The empirical data can be pre-determined information that is collected during the development of the communication device for provisioning to the communication device. In one or more embodiments, table 1200 can be updated based on modifications to modulation schemes, changes to operational requirements (e.g., a service provider's standards change), new modulation schemes, and so forth, where additional testing can be performed based on the new operational circumstances and the new operational criteria (such as changes to the maximum allowable phase and amplitude shifts) can be provisioned to the mobile communication device for use during impedance tuning.

In one or more embodiments, the desired tuning step or value can be obtained from one or more look-up tables 1300 as depicted in FIG. 13. In one embodiment, the look-up table 1300 can be indexed (e.g., by the controller 606 of the communication device 600 of FIG. 6) during operation according to band and/or use case. The look-up table 1300 can be static and/or dynamic. For example, the look-up table 1300 can be pre-loaded into the memory of the communication device 600 based on known or estimated use cases, usage conditions or factors, and so forth. In another example, the look-up table 1300 can be populated or adjusted based on values determined during operation of the communication device 600. The desired tuning step can be based on a subset of use cases that are selected from a group of use cases stored in a memory of the communication device, such as in table 1300.

In one embodiment, a method is provided in which a controller (e.g., controller 302, controller 606) can determine an adjustment to be made to an impedance matching network of a communication device that is utilizing Code Division Multiple Access (CDMA) communication, and in which the controller can adjust the impedance matching network while the communication device is performing at least one of receiving or transmitting signals, where at least two adjacent frames of the CDMA communication have different variable reactance values for the impedance matching network. In one embodiment, the method can include the controller determining a reactance change per frame of the CDMA communication based on an amount of distortion of an RF signal caused by the reactance change.

Figure 14:
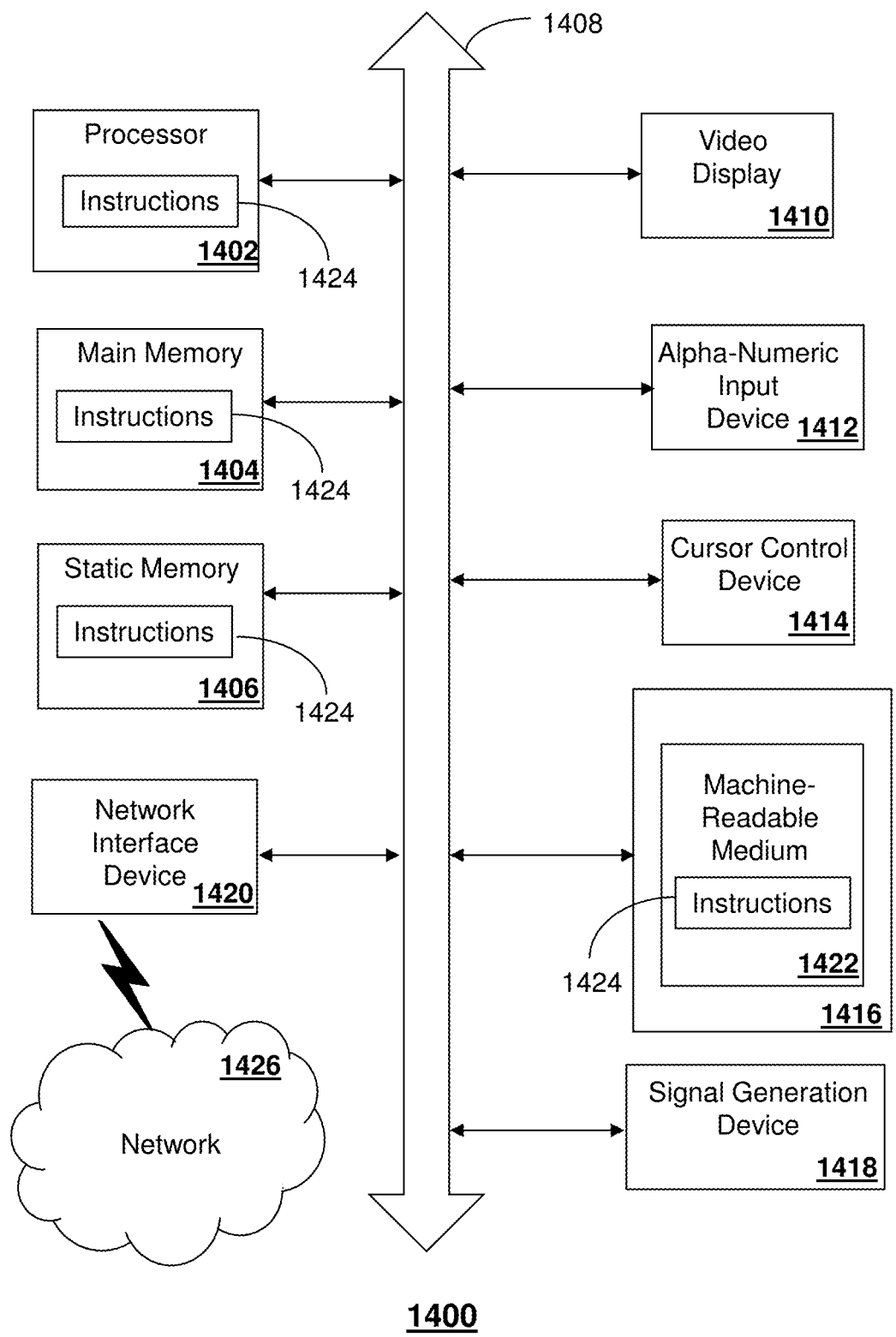
FIG. 14 depicts an exemplary diagrammatic representation of a machine in the form of a computer system within which a set of instructions, when executed, may cause the machine to perform any one or more of the methodologies disclosed herein.

FIG. 14 depicts an exemplary diagrammatic representation of a machine in the form of a computer system 1400 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 1400 may include a processor 1402 (e.g., a central processing unit (CPU), a graphics processing unit (GPU, or both), a main memory 1404 and a static memory 1406, which communicate with each other via a bus 1408. The computer system 1400 may further include a video display unit 1410 (e.g., a liquid crystal display (LCD), a flat panel, a solid state display, or a cathode ray tube (CRT)). The computer system 1400 may include an input device 1412 (e.g., a keyboard), a cursor control device 1414 (e.g., a mouse), a disk drive unit 1416, a signal generation device 1418 (e.g., a speaker or remote control) and a network interface device 1420.

The disk drive unit 1416 may include a machine-readable medium 1422 on which is stored one or more sets of instructions (e.g., software 1424) embodying any one or more of the methodologies or functions described herein, including those methods illustrated above. The instructions 1424 may also reside, completely or at least partially, within the main memory 1404, the static memory 1406, and/or within the processor 1402 during execution thereof by the computer system 1400. The main memory 1404 and the processor 1402 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 1424, or that which receives and executes instructions 1424 from a propagated signal so that a device connected to a network environment 1426 can send or receive voice, video or data, and to communicate over the network 1426 using the instructions 1424. The instructions 1424 may further be transmitted or received over a network 1426 via the network interface device 1420.

While the machine-readable medium 1422 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored. A machine-readable medium of this disclosure may include a transitory medium and/or a non-transitory medium. A non-transitory medium may be capable of storing or encoding a set of instructions for execution by a machine that cause the machine to perform any one or more of the methods of the subject disclosure. The term "non-transitory", as in a non-transitory computer-readable storage medium, includes without limitation memories, drives, devices and anything tangible, but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

In accordance with various embodiments of the subject disclosure, the operations or methods described herein are intended for operation as software programs or instructions running on or executed by a computer processor or other computing device, and which may include other forms of instructions manifested as a state machine implemented with logic components in an application specific integrated circuit (ASIC) or field programmable gate array (FPGA). Furthermore, software implementations (e.g., software programs, instructions, etc.) including, but not limited to, distributed processing or component/object distributed processing, parallel processing, or virtual machine processing can also be constructed to implement the methods described herein. It is further noted that a computing device such as a processor, a controller, a state machine or other suitable device for executing instructions to perform operations or methods may perform such operations directly or indirectly by way of one or more intermediate devices directed by the computing device.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. For example, components and/or steps from different embodiments may be combined. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can be used in supporting a virtual processing environment. The virtual processing environment may support one or more virtual machines representing computers, servers, or other computing devices. In such virtual machines, components such as microprocessors and storage devices may be virtualized or logically represented. The processor can include a state machine, application specific integrated circuit, and/or programmable gate array including a Field PGA. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A device, comprising:
a processing system including a processor; and
a memory that stores executable instructions that, when executed by the processor, facilitate performance of operations, the operations comprising:
identifying a change in a parameter value associated with an antenna;
determining a change in an impedance of the antenna based on the identifying of the change in the parameter value;
identifying a change to a tuning value of a first tunable component of a tuner that is to be enacted based on the determining of the change in the impedance of the antenna, the change to the tuning value of the first tunable component that is to be enacted corresponding to a change in the tuning value from a first tuning value to a second tuning value;
changing the tuning value of the first tunable component from the first tuning value to a third tuning value during a first transition between states of transmission during a communication session that utilizes the antenna, wherein the third tuning value is between the first tuning value and the second tuning value; and
changing the tuning value of the first tunable component from the third tuning value to another tuning value during a second transition between the states of transmission during the communication session, wherein the first transition and the second transition are non-contiguous.

2. The device of claim 1, wherein the communication session is a time division duplex (TDD) based communication session.

3. The device of claim 1, wherein the another tuning value is the second tuning value.

4. The device of claim 1, wherein the another tuning value is a fourth tuning value that is between the third tuning value and the second tuning value.

5. The device of claim 4, wherein the operations further comprise:
changing the tuning value of the first tunable component from the fourth tuning value to the second tuning value during a third transition between the states of transmission during the communication session, wherein the second transition occurs subsequent to the first transition, and wherein the third transition occurs subsequent to the second transition.

6. The device of claim 1, wherein the first tunable component includes a tunable capacitor.

7. The device of claim 6, wherein the tunable capacitor is a barium strontium titanate (BST) capacitor.

8. The device of claim 1, wherein the identifying of the change in the parameter value includes: identifying a change in an environmental factor, identifying a change in frequencies of signals supported by the antenna, identifying a change in a load supported by the antenna, or any combination thereof.

9. The device of claim 8, wherein the identifying of the change in the parameter value includes identifying a change in an ambient weather condition.

10. The device of claim 8, wherein the identifying of the change in the parameter value includes identifying a change in terms of a presence or an absence of an object that interferes with wireless communications in a communication path utilized by the antenna as part of the communication session.

11. The device of claim 8, wherein the identifying of the change in the parameter value includes identifying a change in an amount of communication traffic supported by the antenna.

12. The device of claim 1, wherein the tuner includes a second tunable component, and wherein the operations further comprise:
identifying a change to a second tuning value of the second tunable component that is to be enacted based on the determining of the change in the impedance of the antenna, the change to the second tuning value of the second tunable component that is to be enacted corresponding to a change in the second tuning value from a fourth tuning value to a fifth tuning value; and
changing the second tuning value of the second tunable component from the fourth tuning value to the fifth tuning value during the second transition.

13. The device of claim 12, wherein the change of the tuning value of the first tunable component from the second tuning value to the another tuning value during the second transition is greater than the change of the second tuning value of the second tunable component from the fourth tuning value to the fifth tuning value during the second transition.

14. The device of claim 1, wherein during periods of active transmission in the communication session values of tunable components of the tuner are maintained at constant values.

15. A method, comprising:
- identifying, by a processing system comprising a processor, a change in a value of an impedance associated with an antenna;
- identifying, by the processing system, a number of non-contiguous stages over which to change a tuning value of a tunable component coupled to the antenna based on the identifying of the change in the value of the impedance associated with the antenna, wherein each of the stages corresponds to a ceasing of wireless transmissions via the antenna;
- changing, by the processing system, the tuning value of the tunable component from a first tuning value to a second tuning value during a first stage of the non-contiguous stages; and
- changing, by the processing system, the tuning value of the tunable component from the second tuning value to a third tuning value during a second stage of the non-contiguous stages, wherein the second stage occurs subsequent to the first stage.

16. The method of claim 15, further comprising:
- selecting, by the processing system, the second tuning value such that the change in the tuning value of the tunable component from the first tuning value to the second tuning value during the first stage is completed before the end of the first stage.

17. The method of claim 15, wherein the processing system comprises a digital to analog converter, the method further comprising:
- providing, by the processor, digital serial data to the digital to analog converter that causes the digital to analog converter to change a value of a bias signal that is applied to the tunable component, the change in the value of the bias signal corresponding to the change in the tuning value of the tunable component from the first tuning value to the second tuning value.

18. The method of claim 15, wherein the processing system is included in a baseband processor of a communication system, the method further comprising:
- changing, by the processing system, the tuning value of the tunable component from the first tuning value to a fourth tuning value during a first portion of the first stage; and
- changing, by the processing system, the tuning value of the tunable component from the fourth tuning value to the second tuning value during a second portion of the first stage, wherein the second portion of the first stage occurs subsequent to the first portion of the first stage, and wherein the second tuning value is between the first tuning value and the fourth tuning value.

* * * * *